(12) United States Patent
Schittenhelm

(10) Patent No.: US 6,724,181 B2
(45) Date of Patent: Apr. 20, 2004

(54) METHOD OF CALIBRATING A TEST SYSTEM FOR SEMICONDUCTOR COMPONENTS, AND TEST SUBSTRATE

(75) Inventor: Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/992,290

(22) Filed: Nov. 16, 2001

(65) Prior Publication Data
US 2002/0075030 A1 Jun. 20, 2002

(30) Foreign Application Priority Data
Nov. 16, 2000 (DE) .......................... 100 56 882

(51) Int. Cl.[7] .............................................. G01R 31/26
(52) U.S. Cl. .................................... 324/158.1; 324/765
(58) Field of Search .............................. 324/72.5, 765, 324/158.1, 601, 130, 202; 361/771; 174/261

(56) References Cited

U.S. PATENT DOCUMENTS

| | | | |
|---|---|---|---|
| 5,162,728 A | * | 11/1992 | Huppenthal .................. 324/758 |
| 5,485,080 A | * | 1/1996 | Larrabee et al. .......... 324/158.1 |
| 6,239,590 B1 | * | 5/2001 | Krivy et al. .............. 324/158.1 |
| 6,300,757 B1 | | 10/2001 | Janssen |
| 6,326,801 B1 | * | 12/2001 | Whetsel ....................... 324/765 |
| 6,420,892 B1 | * | 7/2002 | Krivy et al. ................. 324/758 |
| 6,476,630 B1 | * | 11/2002 | Whitten et al. ............. 324/765 |

FOREIGN PATENT DOCUMENTS

| | | |
|---|---|---|
| DE | 198 17 763 A 1 | 11/1999 |
| DE | 199 52 943 A 1 | 6/2001 |
| EP | 1 098 200 A 2 | 5/2001 |
| GB | 2 184 849 A | 7/1987 |

* cited by examiner

Primary Examiner—Evan Pert
Assistant Examiner—Tung X. Nguyen
(74) Attorney, Agent, or Firm—Laurence A. Greenberg; Werner H. Stemer; Ralph E. Locher

(57) ABSTRACT

In order to calibrate a test system for semiconductor components, use is made of a test substrate which has connecting contact points that are associated with one another in pairs. The contact points of the pairs are disposed at different distances from one another and they are connected by conductor tracks of approximately the same length. As a result, equalization of all the signal paths is achieved. In each case, a probe belonging to a probe card or a reference probe is placed onto the connecting contact points of a pair, so that the test system can be calibrated as far as a respective connecting contact of a component.

6 Claims, 1 Drawing Sheet

METHOD OF CALIBRATING A TEST SYSTEM FOR SEMICONDUCTOR COMPONENTS, AND TEST SUBSTRATE

BACKGROUND OF THE INVENTION

1. Field of the Invention

The invention lies in the semiconductor technology field. More specifically, the present invention relates to a method of calibrating a test system, wherein contact is made with semiconductor components to be tested by means of a probe card.

New generations of semiconductor memories operate at clock frequencies of far above 200 MHz. The yield of serviceable components may be increased, and the costs for the incorporation of the chips into their housing and the subsequent testing of the components, may be saved if the required test procedures can be carried out at the wafer level. Test methods of this type are described in UK Patent Application GB 2 184 849 A and U.S. Pat. No. 6,300,757 (German patent application DE 198 17 763 A1). Calibration substrates are used which are provided with a number of components which have been standardized to specific electrical variables or at least accurately measured. The connecting contacts of these components can be connected to a device belonging to the measurement apparatus. That can be a coplanar wave-guide test part belonging to a test system for ICs (see GB 2 184 849 A, page 1, lines 64–72) or an arrangement of measurements tips belonging to the test device (see DE 198 17 763 A1, column 3, lines 9–13).

The connection between the test system and the component is produced by means of a probe card (German patent application DE 199 52 943 A1). Hitherto, the test systems have been calibrated only without a probe card. Signal impairment and propagation-time faults in the probe card cannot therefore be taken into account. In order to be able to take the time-critical parameters appropriately into account during the test, the entire signal path as far as the contact point with the component to be tested must be included in the calibration. Otherwise, testing of components which are provided for high clock frequencies can otherwise only be carried out inadequately.

In order to be able to carry out an adequate calibration of the test system, it is therefore necessary to make contact in each case between a probe on the probe card and a reference probe as a reference point. This reference probe may be an electrical connection independent of the probe card or else one of the probes on the probe card itself, which is selected as a reference probe. Taking into account the large number of probes with which contact is to be made, the calibration method requires automatic contact-making.

SUMMARY OF THE INVENTION

It is accordingly an object of the invention to provide a method for calibrating a test system for semiconductor components and a test substrate, which overcomes the above-mentioned disadvantages of the heretofore-known devices and methods of this general type and which specifies how a test system, which is used for testing semiconductor components at the wafer level and wherein contact is made with a component to be tested by way of a probe card, can be calibrated in such a way that the probe card is included in the calibration.

With the foregoing and other objects in view there is provided, in accordance with the invention, a calibration method for a test system wherein semiconductor components are tested by making contact with a component to be tested via a probe card. The method comprises the following steps:

providing a test substrate having mutually separated connecting contact points for a probe of a probe card, having mutually separated further connecting contact points for a reference probe, and having conductor tracks each connecting one of the connecting contact points to a respective one of the further connecting contact points to define contact point pairs;

placing a probe of a probe card on a connecting contact point and placing a reference probe onto the further connecting contact point of a respective contact point pair; and calibrating the test system, including the probe card, by using the reference probe as a reference point for a respective signal path.

In other words, in order to calibrate a test system for semiconductor components, use is made of a test substrate which has connecting contact points which are associated with one another in pairs and, in accordance with this association in pairs, are arranged at different distances from one another and connected to conductor tracks of approximately equal length. In each case, a probe belonging to a probe card or a reference probe is put onto the connecting contact points of a pair, so that a connection can be calibrated. In this way, the connecting contact points, which are positioned differently with respect to one another from pair to pair, have contact made with them by a respective probe belonging to the probe card and the reference probe, so that all the probes belonging to the probe card can be included in the calibration by means of the reference point provided by the reference probe. The fact that the conductor tracks which connect the two connecting contact points of each pair to each other have approximately the same length means that all the signal paths are equalized.

In accordance with an added feature of the invention, the test substrate is placed into a holder and the test substrate is indexed onward, either by moving the holder or the test substrate within the holder, to connect the probes belonging to a probe card successively to various connecting contact points on the test substrate.

In accordance with another feature of the invention, the test substrate has conductor tracks between a connecting contact point and a further connecting contact point of a contact point pair of approximately the same length.

In accordance with yet another feature of the invention, the test substrate has the further connecting contact points arranged in a straight line.

With the above and other objects in view there is also provided, in accordance with the invention, a test substrate for calibrating a test system for semiconductor components, comprising a plurality of connecting contact points connected in pairs, said contact points of said pairs being disposed at mutually different distances from one another, and a plurality of conductor tracks of substantially equal length respectively connecting said pairs of contact points.

Other features which are considered as characteristic for the invention are set forth in the appended claims.

Although the invention is illustrated and described herein as embodied in a method of calibrating a test system for semiconductor components, and test substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

There follows a more accurate description of an example of the method according to the invention and of an example of a test substrate used for this purpose, using FIGS. 1 and 2.

DESCRIPTION OF THE PREFERRED EMBODIMENTS

Figure 1:
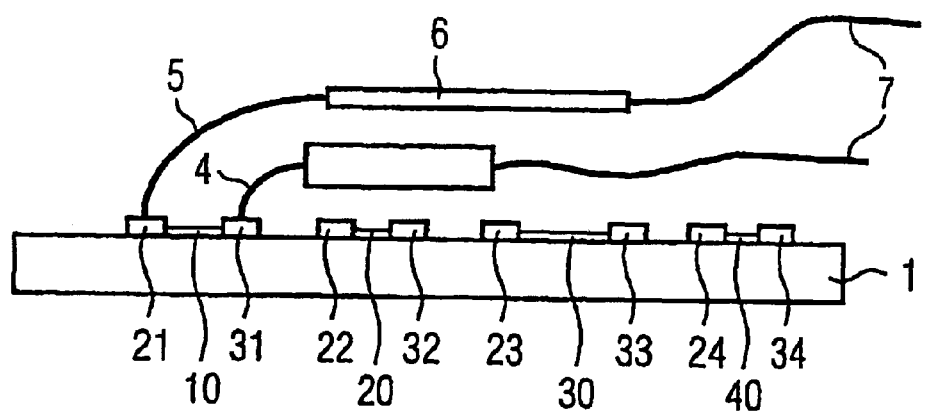
FIG. 1 is a diagrammatic sectional view of a configuration used in the method according to the invention.

Referring now to the figures of the drawing in detail and first, particularly, to FIG. 1 thereof, there is shown a test substrate 1 which is used in the method according to the invention. The test substrate 1 may be a silicon wafer, for example. Connecting contact areas (pads) 21, 22, 23, 24, referred to as contact points in the following, are fitted to the test substrate. Further connecting contact areas 31, 32, 33, 34, also referred to as contact points, are associated with the first-mentioned pads in pairs and are electrically conductively connected to one another by a respective conductor track 10, 20, 30, 40. The pairs of mutually associated connecting contact points do not necessarily have to be disjunct, that is to say, depending on the application of the method, in particular a number of connecting contact points can be connected to the same further connecting contact point via a respective conductor track. In each case, a probe or pin 5 belonging to a probe card 6 is put onto the connecting contact points 21, 22, 23, 24, and is provided with an electrical connecting feed line 7 to the test system. The reference probe or pin 4 of a device likewise connected to the test system via a connecting feed line 7 is placed onto the further connecting contact point 31, 32, 33, 34 which is associated with the respective connecting contact point. The process of making contact with the connecting contact points by means of the probes can be automated, for example carried out by means of a robot.

Figure 2:
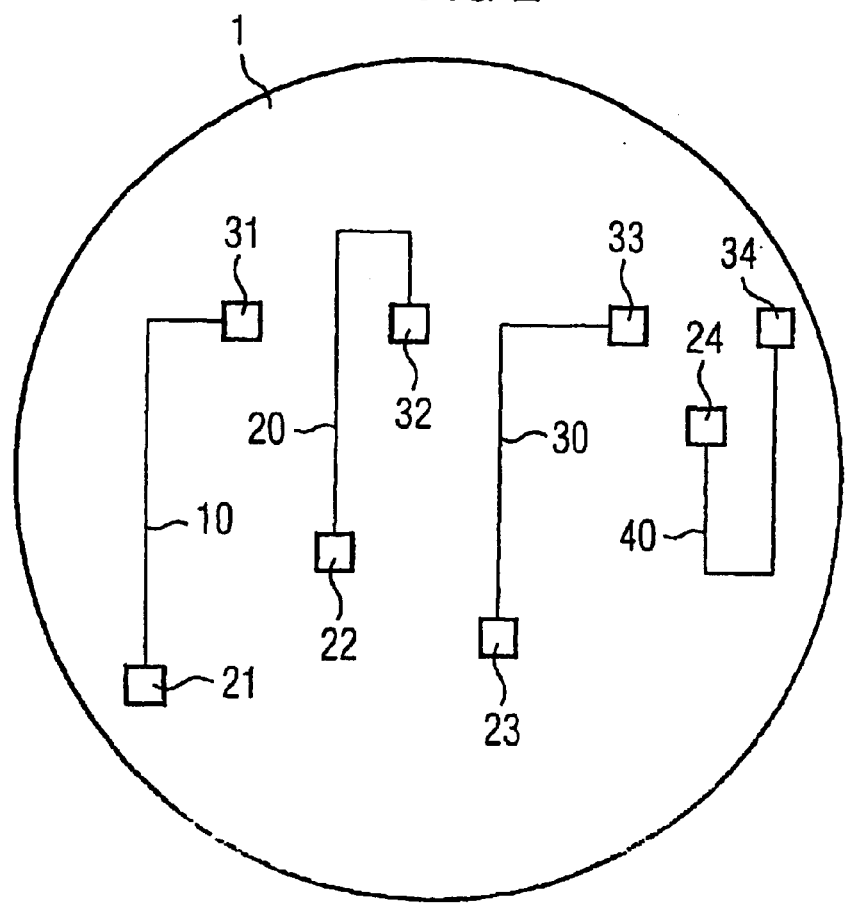
FIG. 2 is a plan view onto a test substrate according to the invention.

With reference to FIG. 2, there is shown a plan view of a test substrate 1, which is shaped like a wafer in this example. By using this extremely simplified and schematic illustration, it can be seen that the connecting contact points 21, 22, 23, 24 are electrically conductively connected in pairs to associated connecting contact points 31, 32, 33, 34 by means of a respective conductor track 10, 20, 30, 40. The connecting contact points associated with one another in pairs are arranged at different distances from one another. The further connecting contact points 31, 32, 33, 34 provided to make contact with a reference probe are here arranged in a straight line. This makes it possible to make contact with these further connecting contact points one after another using the same reference probe, by the test substrate 1 being displaced under the probes from left to right or from right to left in accordance with the alignment of FIG. 2.

The different distance between the connecting contact points of the individual pairs takes account of the fact that the probes of the probe card to be calibrated are at different distances from the reference probe. Since the propagation time of a calibration signal must be the same for all the pairs of connecting contact points with which contact is made as far as the reference probe, the conductor tracks are structured in such a way that the conductive connections between the respectively mutually associated connecting contact points all have approximately the same length. For each type of component to be tested, a dedicated probe card with a specific geometry is used, so that an individually configured test substrate 1 is used to carry out the method.

For the calibration, use can be made in particular of a holder, into which wafers with produced semiconductor components can be inserted for test purposes. Such a holder ("prober") permits accurate positioning of the test substrate 1 with regard to the probe card. For the purpose of calibration, the connecting contact points have to be connected one after another to the individual probes belonging to the probe card, and the further connecting contact points which are respectively associated with these connecting contact points have to be connected to a reference probe. For this purpose the test substrate is preferably displaced with respect to the reference probe in the direction of successive further connecting contact points. The reference probes are then put one after another onto the further connecting contact points. The contact point 21, 22, 23, 24 in each case electrically conductively connected thereto then serves to make the conductive connection between a respective probe belonging to the probe card and the reference probe.

A particular advantage of this method resides in the fact that devices for testing semiconductor wafers with components can be used for the calibration according to the invention. The method described provides a simple possible way of electrically conductively connecting probes belonging to a probe card one after another to a respective reference probe. In addition, a modification of the test substrate, which can be implemented without problems, simultaneously permits a plurality of probes to be connected to a single reference probe or in each case to a reference probe from a large number of reference probes. It is therefore possible for various calibration steps using various calibration signals, which can be used independently of one another, to be carried out simultaneously and in parallel, which shortens and further simplifies the overall calibration method. All such refinements and modifications of the method may be implemented in a simple way by only the structuring of the conductors on the test substrate used being adapted in a suitable way.

I claim:

1. A calibration method for a test system wherein semiconductor components are tested by making contact with a component to be tested via a probe card, the method which comprises:

providing a test substrate having mutually separated connecting contact points for a probe of a probe card, having mutually separated further connecting contact points for a reference probe, and having conductor tracks each connecting one of the connecting contact points to a respective one of the further connecting contact points to define contact point pairs;

placing a probe of a probe card on a connecting contact point and placing a reference probe onto the further connecting contact point of a respective contact point pair; and calibrating the test system, including the probe card, by using the reference probe as a reference point for a respective signal path and adjusting the signal path to obtain same propagation-times for all signals.

2. The method according to claim 1, which comprises placing the test substrate into a holder and indexing the test substrate onward, to connect the probes belonging to a probe card successively to various connecting contact points on the test substrate.

3. The method according to claim 2, wherein the indexing step comprises moving the holder together with the test substrate.

4. The method according to claim 2, wherein the indexing step comprises moving the test substrate in the holder onward.

5. The method according to claim 1, wherein the providing step comprises providing a test substrate having conductor tracks between connecting contact point and the further connecting contact point of a contact point pair of approximately the same length.

6. The method according to claim 1, wherein the providing step comprises providing a test substrate having the further connecting contact points arranged in a straight line.

* * * * *